(12) United States Patent
Mongold et al.

(10) Patent No.: US 9,130,313 B2
(45) Date of Patent: *Sep. 8, 2015

(54) CENTER CONDUCTOR WITH SURROUNDING SHIELD AND EDGE CARD CONNECTOR WITH SAME

(71) Applicant: Samtec, Inc., New Albany, IN (US)

(72) Inventors: John Mongold, Middletown, PA (US); Justin McAllister, Dillsburg, PA (US)

(73) Assignee: Samtec, Inc., New Albany, IN (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/247,415

(22) Filed: Apr. 8, 2014

(65) Prior Publication Data

US 2014/0220820 A1 Aug. 7, 2014

Related U.S. Application Data

(63) Continuation of application No. 13/225,639, filed on Sep. 6, 2011, now Pat. No. 8,727,809.

(51) Int. Cl.
*H01R 13/648* (2006.01)
*H01R 13/6585* (2011.01)
*H01R 12/72* (2011.01)
*H05K 1/02* (2006.01)

(52) U.S. Cl.
CPC .......... *H01R 13/6585* (2013.01); *H01R 12/721* (2013.01); *H05K 1/0218* (2013.01)

(58) Field of Classification Search
CPC ............... H01R 23/688; H01R 13/658; H01R 13/65805; G01R 1/045
USPC ............ 439/607.14, 607.05, 607.13, 607.08, 439/60, 637, 579
See application file for complete search history.

(56) References Cited

U.S. PATENT DOCUMENTS

| | | | | |
|---|---|---|---|---|
| 3,737,838 A | * | 6/1973 | Mattingly et al. | 439/634 |
| 3,760,486 A | * | 9/1973 | Rifkin et al. | 29/278 |
| 3,871,728 A | * | 3/1975 | Goodman | 439/62 |
| 4,636,021 A | * | 1/1987 | Bobb et al. | 439/260 |
| 4,968,265 A | * | 11/1990 | Fox, Jr. | 439/197 |
| 5,024,609 A | * | 6/1991 | Piorunneck | 439/637 |
| 5,035,631 A | * | 7/1991 | Piorunneck et al. | 439/108 |
| 5,221,218 A | * | 6/1993 | Marach | 439/637 |
| 5,259,795 A | * | 11/1993 | Yamada et al. | 439/751 |
| 5,564,931 A | * | 10/1996 | Fabian et al. | 439/62 |
| 5,599,595 A | * | 2/1997 | McGinley et al. | 428/33 |
| 5,713,764 A | * | 2/1998 | Brunker et al. | 439/636 |

(Continued)

OTHER PUBLICATIONS

Mongold et al., "Center Conductor With Surrounding Shield and Edge Card Connector With Same", U.S. Appl. No. 13/225,639, filed Sep. 6, 2011.

*Primary Examiner* — Abdullah Riyami
*Assistant Examiner* — Vladimir Imas
(74) *Attorney, Agent, or Firm* — Keating & Bennett, LLP

(57) ABSTRACT

An edge card connector includes a connector housing; a plurality of center conductors disposed in the connector housing, spaced apart from one another, and arranged to make contact with a surface of an edge card when the edge card is inserted into the edge card connector; and a plurality of shields disposed in the connector housing, surrounding three sides of a corresponding one of the plurality of center conductors, and arranged to make contact with the surface of the edge card when the edge card is inserted into the edge card connector.

22 Claims, 19 Drawing Sheets

(56) References Cited

U.S. PATENT DOCUMENTS

| | | | |
|---|---|---|---|
| 5,842,885 A * | 12/1998 | Takamoto et al. | 439/607.01 |
| 5,853,303 A * | 12/1998 | Brunker et al. | 439/637 |
| 5,904,581 A * | 5/1999 | Pope et al. | 439/74 |
| 5,921,815 A * | 7/1999 | Brunker et al. | 439/636 |
| 6,019,616 A * | 2/2000 | Yagi et al. | 439/108 |
| 6,129,555 A * | 10/2000 | Daikuhara et al. | 439/60 |
| 6,135,781 A * | 10/2000 | Pope et al. | 439/59 |
| 6,203,387 B1 * | 3/2001 | Daly et al. | 439/886 |
| 6,254,435 B1 * | 7/2001 | Cheong et al. | 439/637 |
| 6,343,955 B2 * | 2/2002 | Billman et al. | 439/607.48 |
| 6,364,710 B1 * | 4/2002 | Billman et al. | 439/607.11 |
| 6,368,121 B1 * | 4/2002 | Ueno et al. | 439/108 |
| 6,394,823 B1 * | 5/2002 | Dunham et al. | 439/108 |
| 6,425,766 B1 * | 7/2002 | Panella | 439/59 |
| 6,527,587 B1 * | 3/2003 | Ortega et al. | 439/607.05 |
| 6,695,627 B2 * | 2/2004 | Ortega et al. | 439/78 |
| 6,764,341 B2 * | 7/2004 | Lappoehn | 439/607.05 |
| 7,029,334 B2 * | 4/2006 | Shibuya | 439/660 |
| 7,150,652 B1 * | 12/2006 | Jeon | 439/607.13 |
| 7,239,528 B1 * | 7/2007 | McLeod | 361/796 |
| 7,294,019 B1 * | 11/2007 | Jeon | 439/607.05 |
| 7,410,392 B2 * | 8/2008 | Szczesny et al. | 439/607.05 |
| 7,503,773 B2 * | 3/2009 | Tokunaga | 439/74 |
| 7,775,839 B1 * | 8/2010 | Okuyama et al. | 439/733.1 |
| 8,083,526 B2 * | 12/2011 | Long | 439/60 |
| 8,231,411 B1 * | 7/2012 | Westman et al. | 439/607.05 |
| 2010/0173507 A1 * | 7/2010 | Vicich et al. | 439/82 |
| 2010/0248517 A1 * | 9/2010 | Li et al. | 439/327 |

* cited by examiner

CENTER CONDUCTOR WITH SURROUNDING SHIELD AND EDGE CARD CONNECTOR WITH SAME

BACKGROUND OF THE INVENTION

1. Field of the Invention

The present invention relates to an edge card connector and more specifically, to an edge card connector with signal pins and surrounding shields to reduce or eliminate crosstalk between adjacent signal pins.

2. Description of the Related Art

Known electrical connectors include electrical pins arranged in an array. The electrical pins are typically conductors that can transmit electrical signals (i.e., signal pins), that can be connected to ground (i.e., ground return pins), or that can transmit electrical power (i.e., power pins). Crosstalk between adjacent signal pins is a known problem that occurs in electrical connectors. Crosstalk between adjacent signal pins is increasingly difficult to reduce or prevent as the number of signal pins increases and the density of the signal pins increases (i.e., as the distance between adjacent signal pins decreases).

One known method to reduce crosstalk is to provide one or more ground return pins between the signal pins. The ground return pins enable the signal pins to be electrically isolated from one another. However, with this arrangement, the required number of signals pins in an electrical connector is greatly increased, which disadvantageously increases the size of the electrical connector and decreases the density of the signal pins.

Another known method to reduce crosstalk is to provide a shield around each of the signal pins. This is especially true for signal pins that transmit signals at radio frequency. Known implementations of this method include RF connectors such as SMA connectors and BNC connectors. However, these implementations are not used with edge card connectors.

Another known method to reduce crosstalk is to increase the distance between the signal pins, which decreases the density of the signal pins. However, this method also suffers from the problem of increasing the size of the electrical connector.

Thus, as the number of signal pins increases, there has been an increasing need for a connector design which prevents or minimizes crosstalk between adjacent signal pins while not substantially increasing the size of the electrical connector. If the size of the electrical connector is an edge card connector and if the size of the electrical connector must be increased, then the edge card that is to be inserted into the edge card connector must also be increased.

SUMMARY OF THE INVENTION

To overcome the problems described above, preferred embodiments of the present invention provide an edge card connector which effectively prevents or minimizes crosstalk between adjacent signal pins while not substantially increasing the size of the connector.

According to a preferred embodiment of the present invention, an edge card connector includes a connector housing; a plurality of center conductors disposed in the connector housing, spaced apart from one another, and arranged to make contact with a surface of an edge card when the edge card is inserted into the edge card connector; and a plurality of shields disposed in the connector housing, surrounding three sides of a corresponding one of the plurality of center conductors, and arranged to make contact with the surface of the edge card when the edge card is inserted into the edge card connector.

Each of the plurality of shields is preferably U-shaped or substantially U-shaped. The edge card connector further preferably includes a plurality of contacts. The plurality of center conductors and the plurality of shields are preferably arranged to contact a first side of the edge card when the edge card is inserted into the edge card connector, and the plurality of contacts are preferably arranged to contact a second side of the edge card opposite to the first side of the edge card when the edge card is inserted into the edge card connector.

The plurality of contacts are preferably arranged to provide a normal force to bias the edge card against the plurality of center conductors and against the plurality of shields. A number of the plurality of contacts is preferably approximately three times a number of the plurality of shields. Each of the plurality of shields preferably includes first and second sidewalls that are spaced apart from one another and a back wall connecting the first and second sidewalls. The back wall of each of the plurality of shields preferably includes a base portion, an upper portion that is connected to the first and second sidewalls, and a narrow beam portion connecting the base portion and the upper portion; and the narrow beam portion is preferably arranged to enable the upper portion to rotate about two different axes and to be linearly displaced with respect to the base portion.

The first and second sidewalls of each of the plurality of shields are preferably directly connected to the upper portion of the back wall and are not directly connected to the narrow beam portion or to the base portion of the back wall. Each of the plurality of shields preferably includes at least one tail that extends from the base portion and that is arranged to be soldered to solder pads of a printed circuit board on which the edge card connector is mounted. Each of the plurality of shields preferably includes a shield plane that extends from the at least one tail. The first and second sidewalls preferably include edges that are arranged to be in contact with contact pads of the edge card when the edge card is inserted into the edge card connector. The first and second sidewalls and the back wall of each of the plurality of shields are preferably arranged to cooperate with the edge card to surround four sides of a corresponding one of the plurality of center conductors when the edge card is inserted into the edge card connector.

According to another preferred embodiment of the present invention, a shield for use in an edge card connector to shield a center conductor from crosstalk includes first and second spaced apart sidewalls and a back wall extending between the first and second sidewalls. The back wall includes a base portion, an upper portion that is connected to the first and second sidewalls, and a narrow beam portion connecting the base portion and the upper portion, and the narrow beam portion is arranged to enable the upper portion to rotate about two different axes and to be linearly displaced with respect to the base portion.

The first and second sidewalls are preferably directly connected to the upper portion of the back wall and are not directly connected to the narrow beam portion or to the base portion of the back wall. The shield preferably further includes at least one tail extending from the base portion and arranged to be soldered to solder pads of a printed circuit board upon which the shield is mounted. The shield preferably further includes a shield plane extending from the at least one tail.

Each of the first and second sidewalls preferably includes an edge that is arranged to be in contact with a contact pad of an edge card when the edge card is inserted into the edge card connector. The first and second sidewalls and the back wall are preferably arranged to cooperate with the edge card to surround four sides of the center conductor when the edge card is inserted into the edge card connector.

The above and other features, elements, characteristics and advantages of the present invention will become more apparent from the following detailed description of preferred embodiments of the present invention with reference to the attached drawings.

DETAILED DESCRIPTION OF PREFERRED EMBODIMENTS

Preferred embodiments of the present invention will be described with reference to FIGS. 1-14E.

Figure 1:
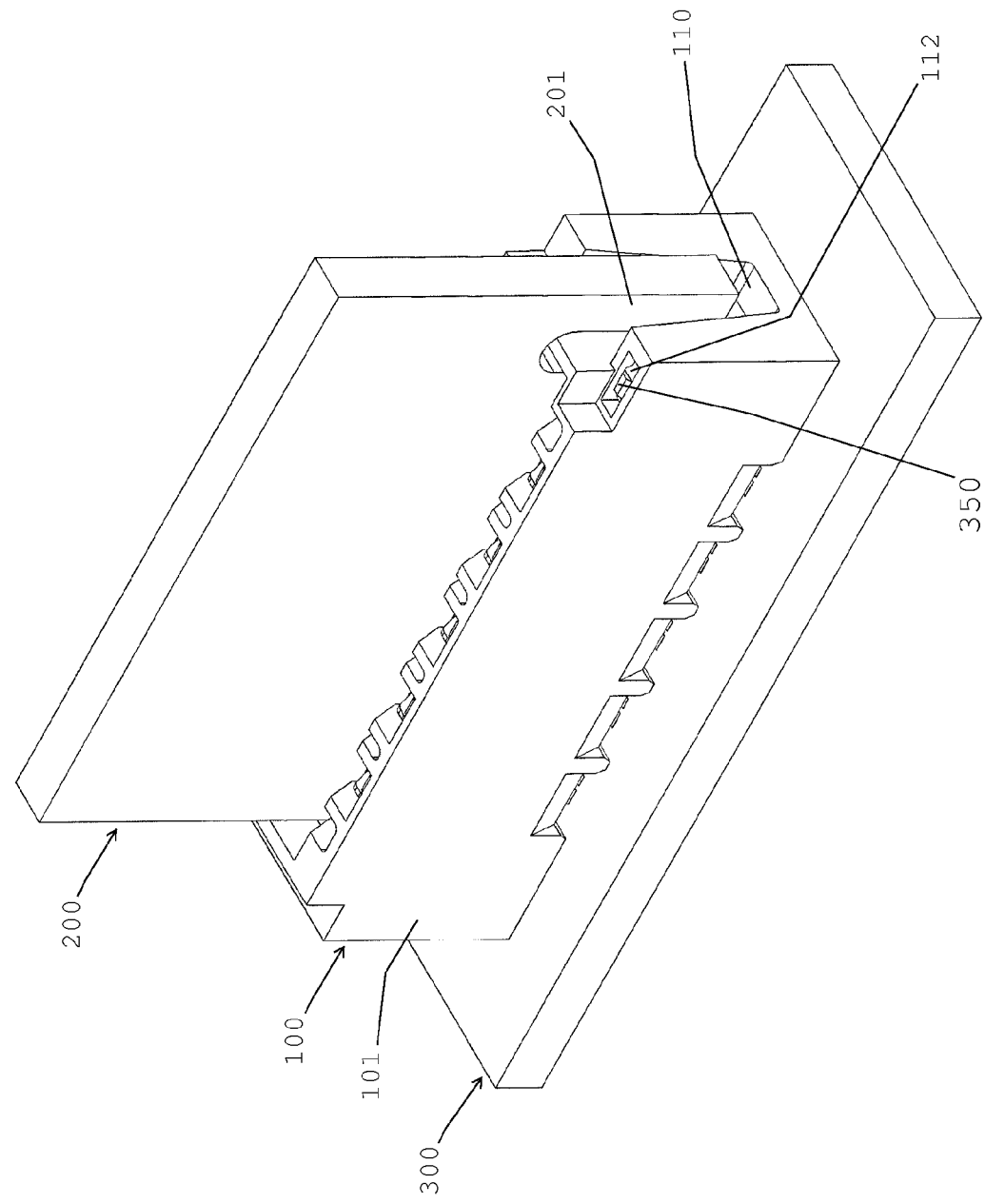
FIG. 1 is a perspective view of a connector and an edge card that are mounted on a printed circuit board according to a preferred embodiment of the present invention.

FIG. 1 shows the basic structure of a connector 100 mounted on a printed circuit board 300 and an edge card 200 inserted in the connector 100.

Figure 2:
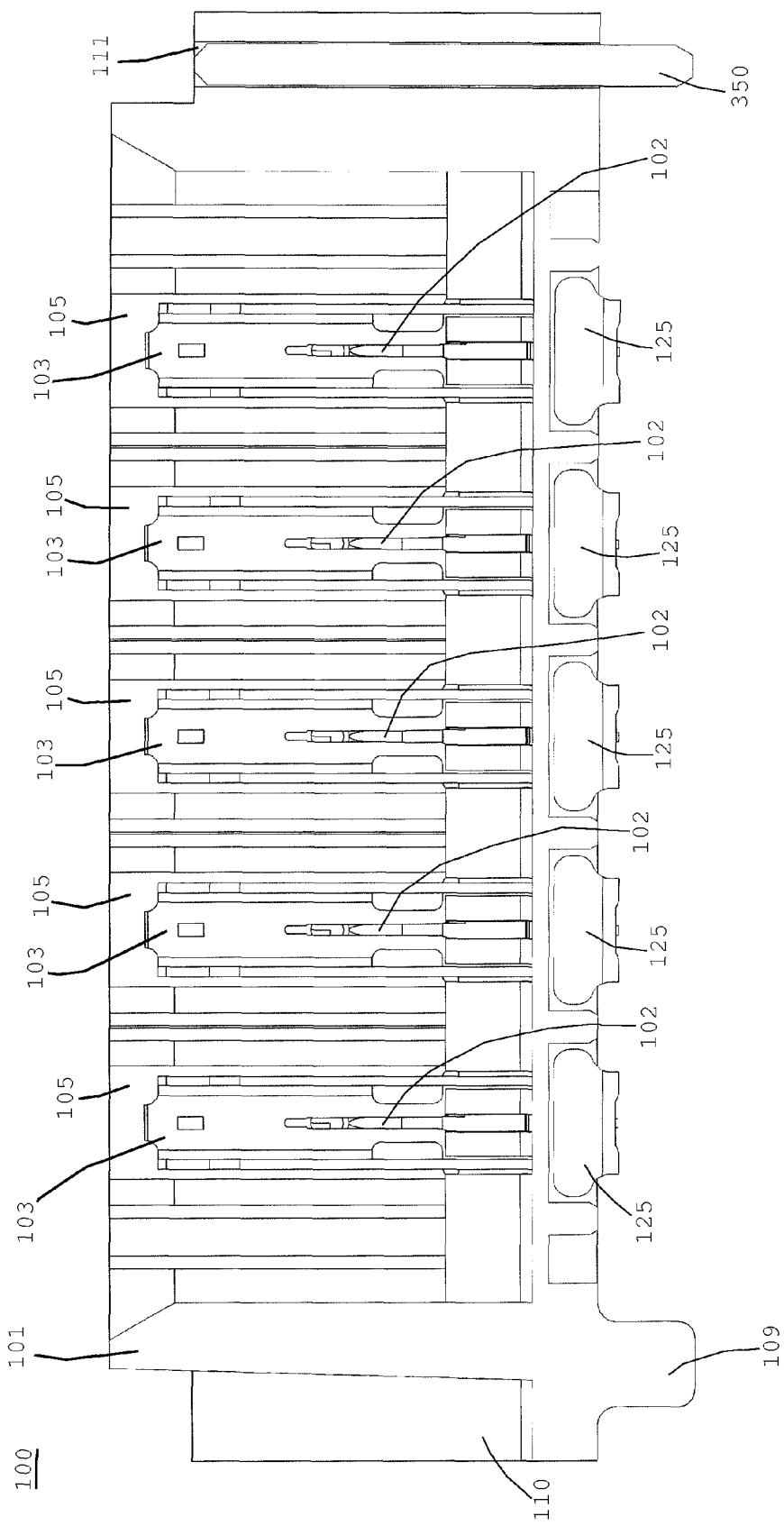
FIG. 2 is a cross-sectional view of the connector shown in FIG. 1.
Figure 3:
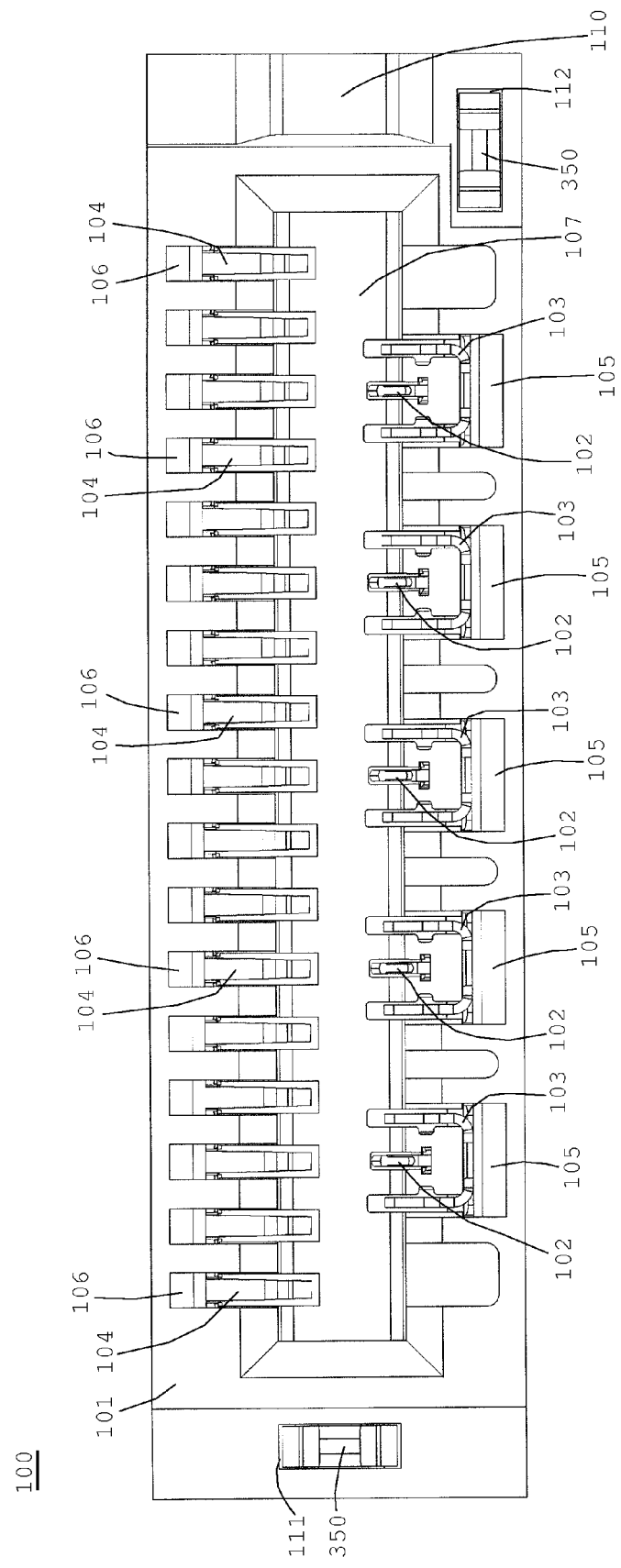
FIG. 3 is a top view of the connector shown in FIG. 1.
Figure 4:
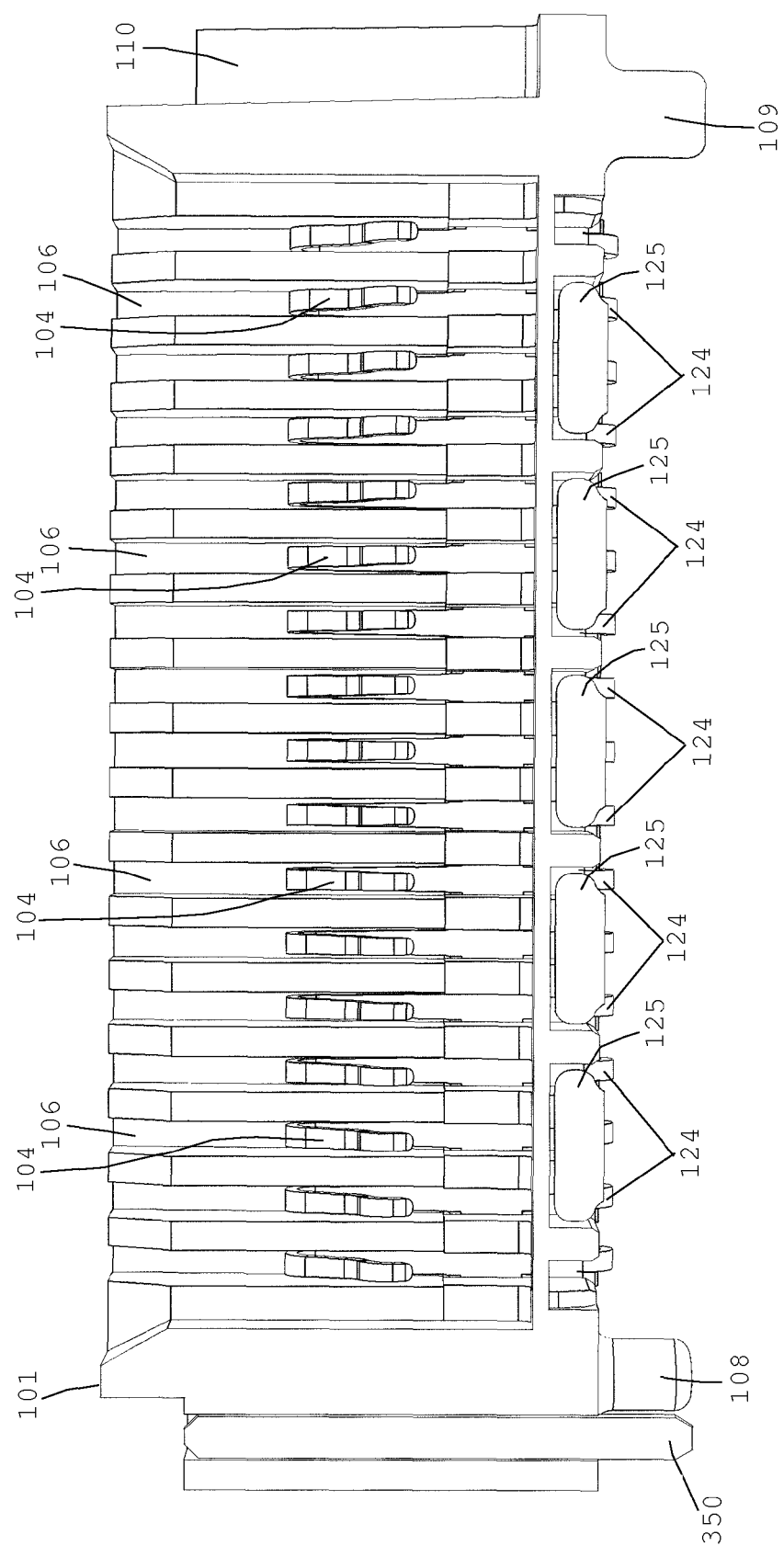
FIG. 4 is another cross-sectional view of the connector shown in FIG. 1.
Figure 5:
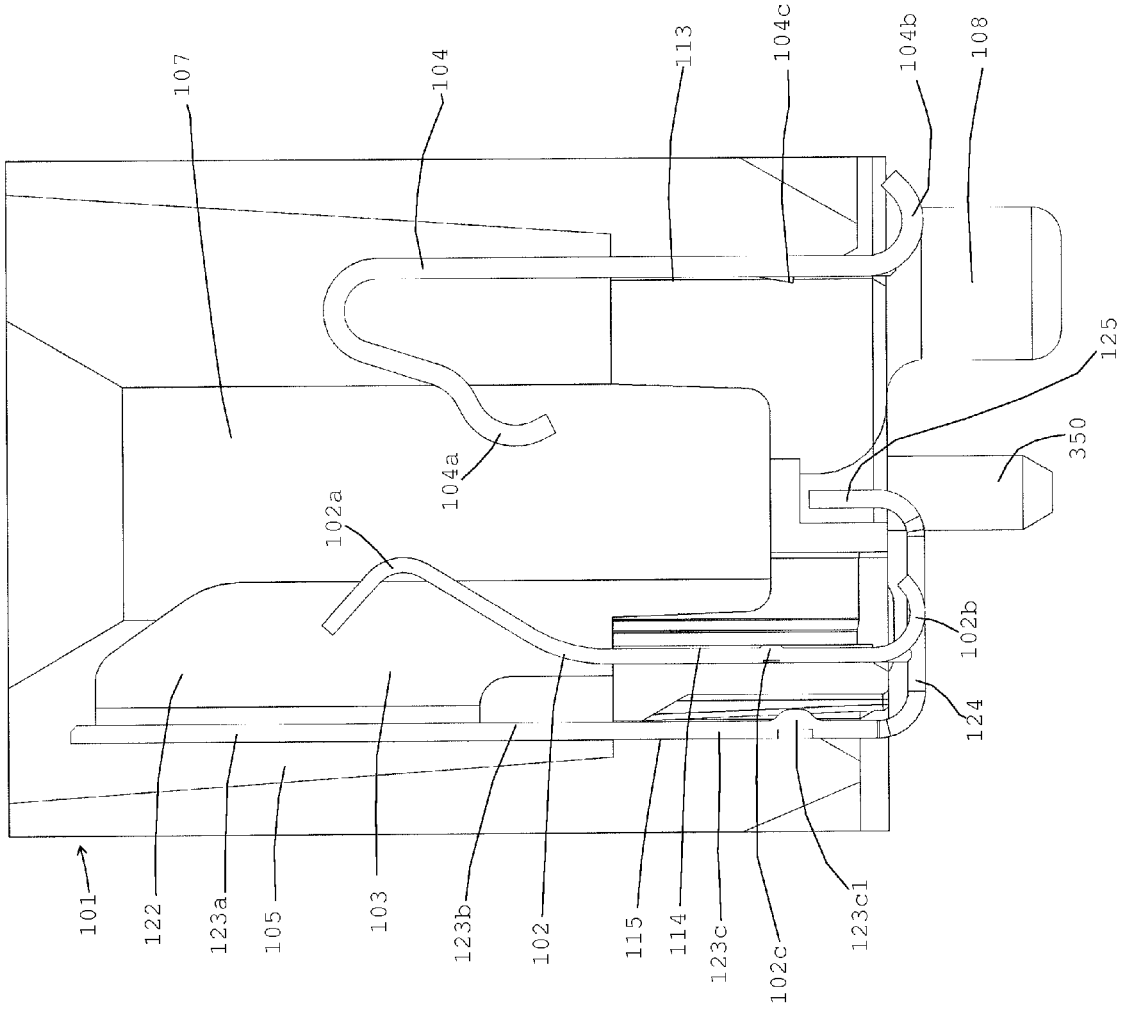
FIG. 5 is another cross-sectional view of the connector shown in FIG. 1.

FIGS. 2-5 show the internal structure of the connector 100 according to a preferred embodiment of the present invention. As shown in FIGS. 2-5, the connector includes a connector housing 101, center conductors 102, shields 103, and contacts 104. As best shown in FIGS. 2 and 3, each of the shields 103 is disposed in an opening 105 provided in the connector housing 101, and the openings 105 are configured such that a space is provided between the respective opening 105 and an upper portion of the respective shield 103 inserted into the opening. As seen in FIG. 5, the openings 15 are sloped such that the upper portion of the shields 103 can move relative to the connector housing 101.

Although the edge card 200 is not shown in FIG. 5, as the edge card 200 is inserted into the elongated slot 107 of the connector 100 between the center conductors 102 and the contacts 104, the upper portions of the shields 103 can move outward, away from the edge card 200. Each of the shields 103 surrounds three sides of a respective center conductor 102. When the edge card 200 is inserted into the connector 100, the edge card 200 extends along the fourth side so that the center conductors are surrounded on three sides by the shields 103 and surrounded on the fourth side by the edge card 200. Preferably, the edge card 200 includes one or more ground planes within the edge card 200 so that the center conductors 102 are shielded on all sides. It is also possible to have the ground plane located on an outer surface of the edge card 200. With this arrangement, the center conductor 102, the shield 103, and the ground plane within the edge card 200 form a coaxial structure.

The edge card 200 can be any kind of suitable edge card. It is also possible to use edge cards 200 having different thicknesses.

As best shown in FIGS. 3 and 4, each contact 104 is disposed in a corresponding opening 106 provided in the connector housing 101. Preferably, the contact 104 is a cantilevered contact; however, any suitable contact could also be used. For the sake of simplicity, only some of the contacts 104 and the corresponding openings 106 are labeled in the drawings. As shown in FIG. 3, the central portion of the connector housing 101 includes the elongated slot 107 that is configured to accommodate the edge card 200, including edge cards 200 having different thicknesses. As shown in FIG. 4, the connector housing 101 preferably includes alignment pins 108 and 109 that are arranged to be inserted into receiving holes in the printed circuit board 300 when the connector 100 is mounted to the printed circuit board 300. The alignment pins 108 and 109 are preferably polarized to properly align and orient the connector housing 101 on the printed circuit board 300. The alignment pins 108 and 109 can have different sizes or shapes and/or can be asymmetrically arranged with respect to the connector body 101. In the present preferred embodiment, the connector 100 preferably includes two alignment pins 108 and 109, for example. However, any suitable number and arrangement of alignment pins 108 and 109 can be included.

Figure 15:
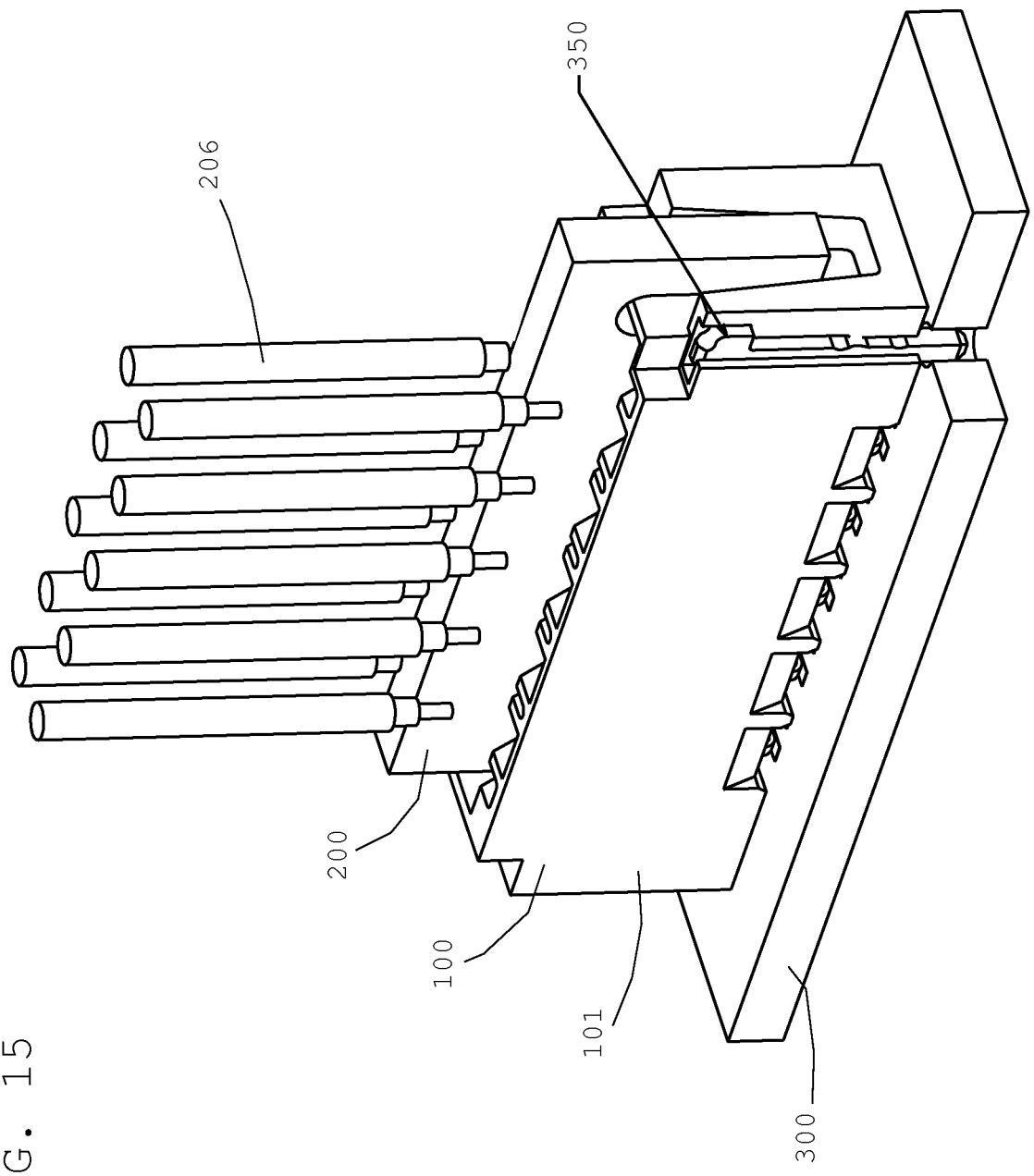
FIG. 15 shows a connector in a cut-away view showing a weld tab according to a preferred embodiment of the present invention.

As shown in FIG. 15, the connector housing 101 can also include holes 111 and 112 that can be arranged to receive a weld tab 350. When the edge card 200 requires a high cantilever load, possibly because of cables 206 attached to the edge card 200, it is possible to use weld tabs 250 to reduce the stress on the solder joints between the contacts 104, shields 103, and center conductors 102 and the printed circuit board 300. The weld tab 350 can be welded to the printed circuit board 300 or can extend through a hole in the printed circuit board 300 and then welded to the printed circuit board 300, for example.

The connector housing 101 is preferably polarized such that the edge card 200 can be inserted into the connector housing 101 in only one orientation. FIG. 1 shows one polarization scheme in which the connector housing 101 includes a groove 110 at one end into which a leg 201 of the edge card 200 is inserted when the edge card 200 is inserted into the elongated slot 107 of the connector housing 101. The other end of the connector housing 101 preferably does not include any groove. Thus, if the edge card 200 is attempted to be inserted into the connector housing 101 with the wrong orientation, contact between the leg 201 of the edge card 200 and the other end of the connector housing 101, i.e., the end without the groove, prevents such incorrect insertion. Although the groove 110 of the connector housing 101 and the leg 201 of the edge card 200 are preferably provided in the present preferred embodiment to prevent the edge card 200 from being inserted in the connector housing 101 with the wrong orientation, other polarization schemes can be used. For example, it is possible to include one or more ribs within the elongated slot 107 of the connector housing 101 that work in cooperation with one or more corresponding slots along the edge of an edge card such the edge card 200 can only be inserted into the elongated slot 107 in one orientation.

Figure 13:
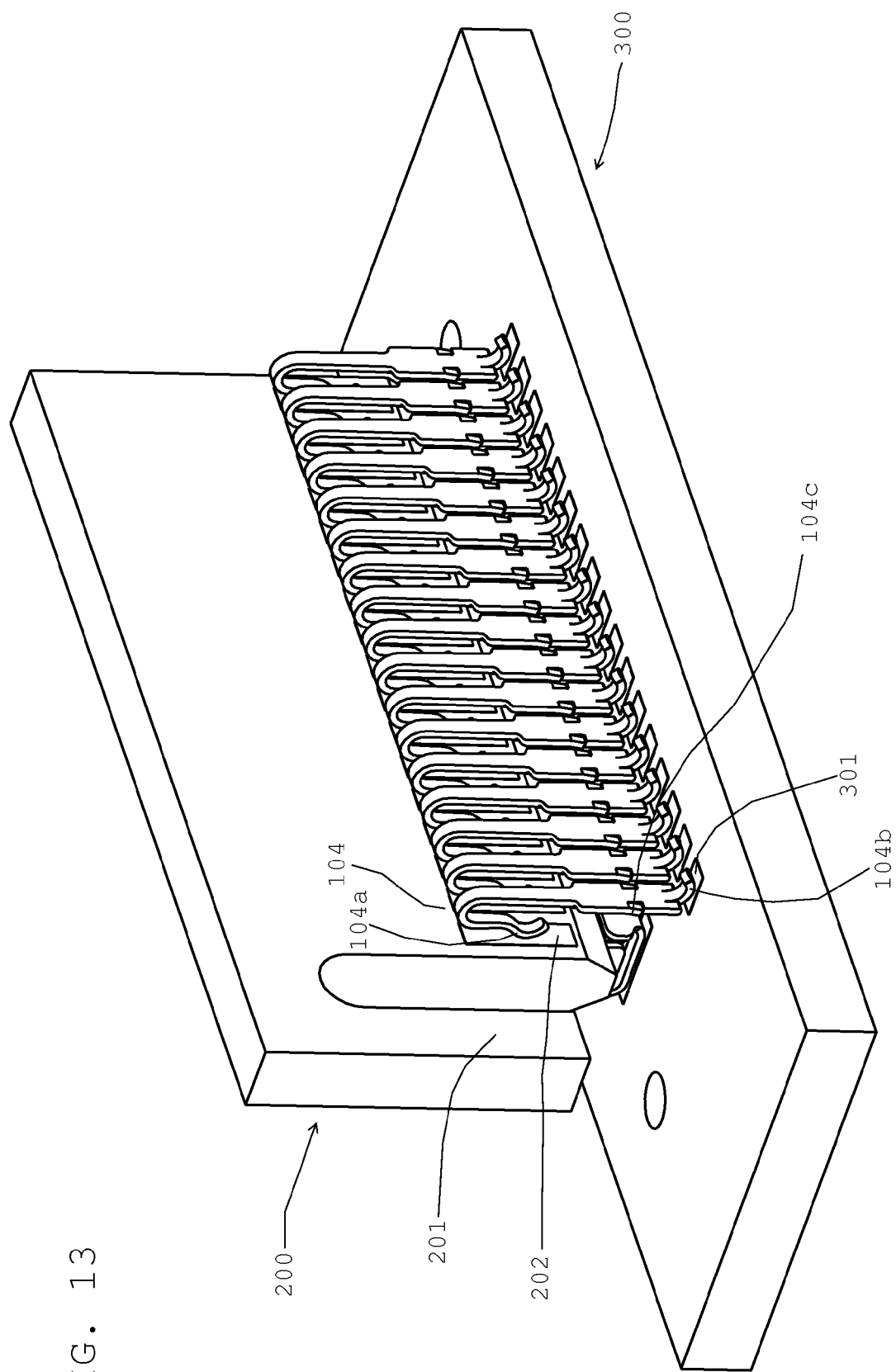
FIG. 13 is another perspective view of the edge card mounted on the printed circuit board shown in FIG. 1 without showing the connector housing.

As best shown in FIGS. 5 and 13, each contact 104 preferably includes a head 104a at one end and a tail 104b at the other end of the contact 104. The head 104a preferably includes a hook shape or a substantial hook shape and is arranged to make contact with a contact pad 202 of the edge card 200. The tail 104b is arranged to be attached to a solder pad 301 of the printed circuit board 300, preferably by solder, although other methods could be used. The head 104a is preferably arranged to curve away from a surface of the edge card 200, and the tail 104b is preferably arranged to curve away from a surface of the printed circuit board 300. An intermediate portion between the head 104a and tail 104b of each contact 104 preferably includes two barb 104c for securing each contact 104 in the slots 113. The barb 104c preferably engages with a surface of the slot 113 to press fit the contact 104 in the slot 113 and to prevent the contact 104 from moving within the slot 113. Although the contact 104 according to the present preferred embodiment includes two barbs 104c, any suitable number of barbs 104c can be used and any suitable structure can be used to prevent the contact 104 from moving within the slot 113, such as one or more projections extending from a side of the contact 104.

The contacts 104 are preferably arranged in the connector housing 101 to extend into the elongated slot 107 to make contact with the edge card 200 when the edge card 200 is inserted into the elongated slot 107, to be elastically deformed when the edge card 200 is inserted into the elongated slot 107, and to provide a normal pressing force against the edge card 200 such that the edge card 200 is securely pressed against each of the center conductors 102 and each of the shields 103.

Figure 12:
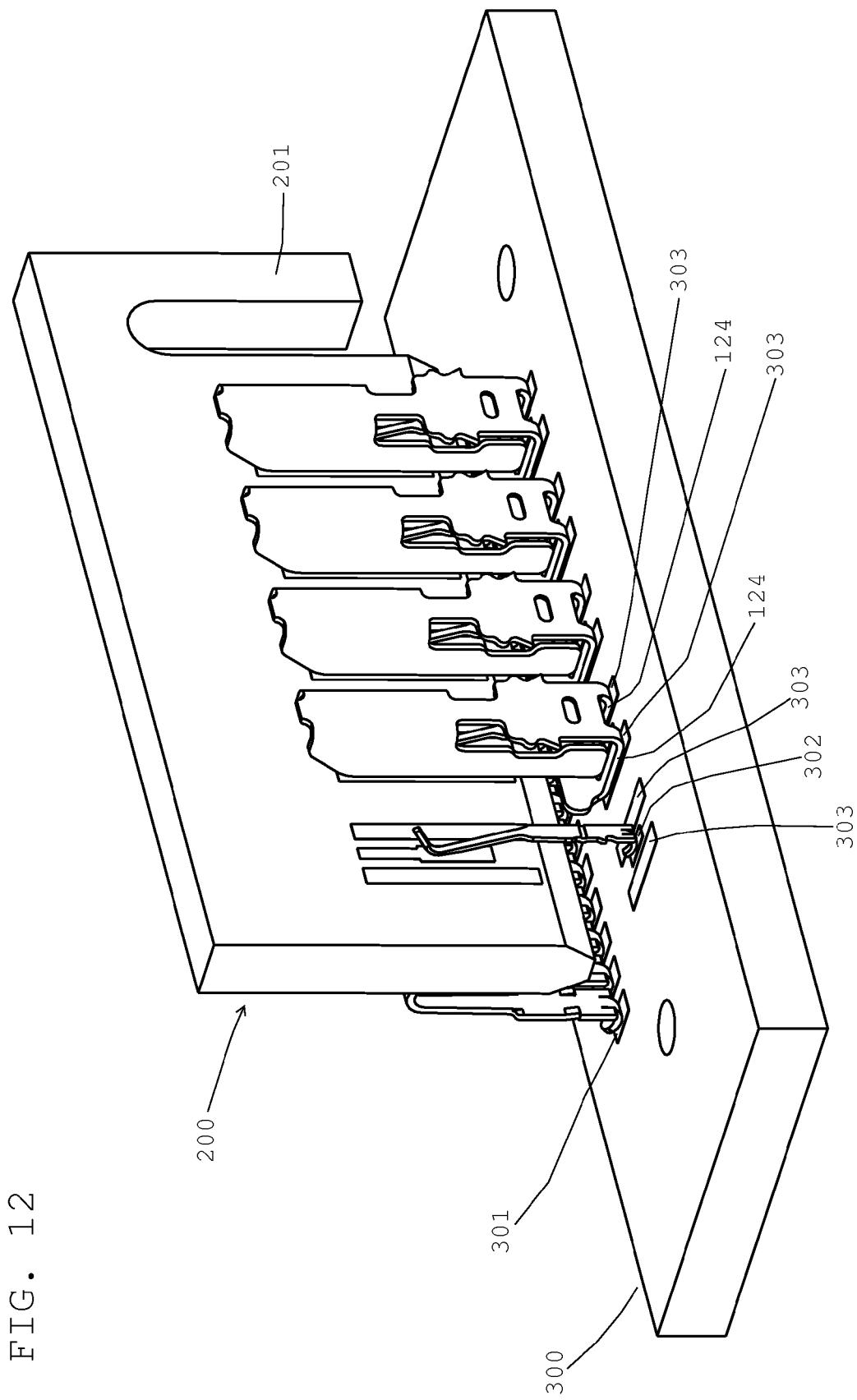
FIG. 12 is a perspective view of the edge card mounted on the printed circuit board shown in FIG. 1 without showing the connector housing.

As shown in FIGS. 5 and 12, each center conductor 102 preferably includes a head 102a at one end and a tail 102b at the other end. Preferably, the center conductor is cantilevered; however, any suitable contact could be used. The head 102a is arranged to make contact with a contact pad 203 provided on the edge card 200 when the edge card 200 is inserted into the elongated slot 107. The tail 102b is arranged to be attached to a solder pad 302 on the printed circuit board 300, preferably by solder, although other methods could be used. An intermediate portion between the head 102a and the tail 102b of the center conductor 102 preferably includes a projection 102c for securing each center conductor 102 in the slots 114. The projection 102c engages with a surface of the slot 114 to press fit the center conductor 102 in the slot 114 and to prevent the center conductor 102 from moving within the slot 114. Although the center conductor 102 according to the present preferred embodiment preferably includes one projection 102c, any suitable number of projections 102c can be used and any suitable structure can be used to prevent the center conductor 102 from moving within the slot 114, such as one or more barbs, including planar barbs, extending from a side of the center conductor 102.

Figure 6:
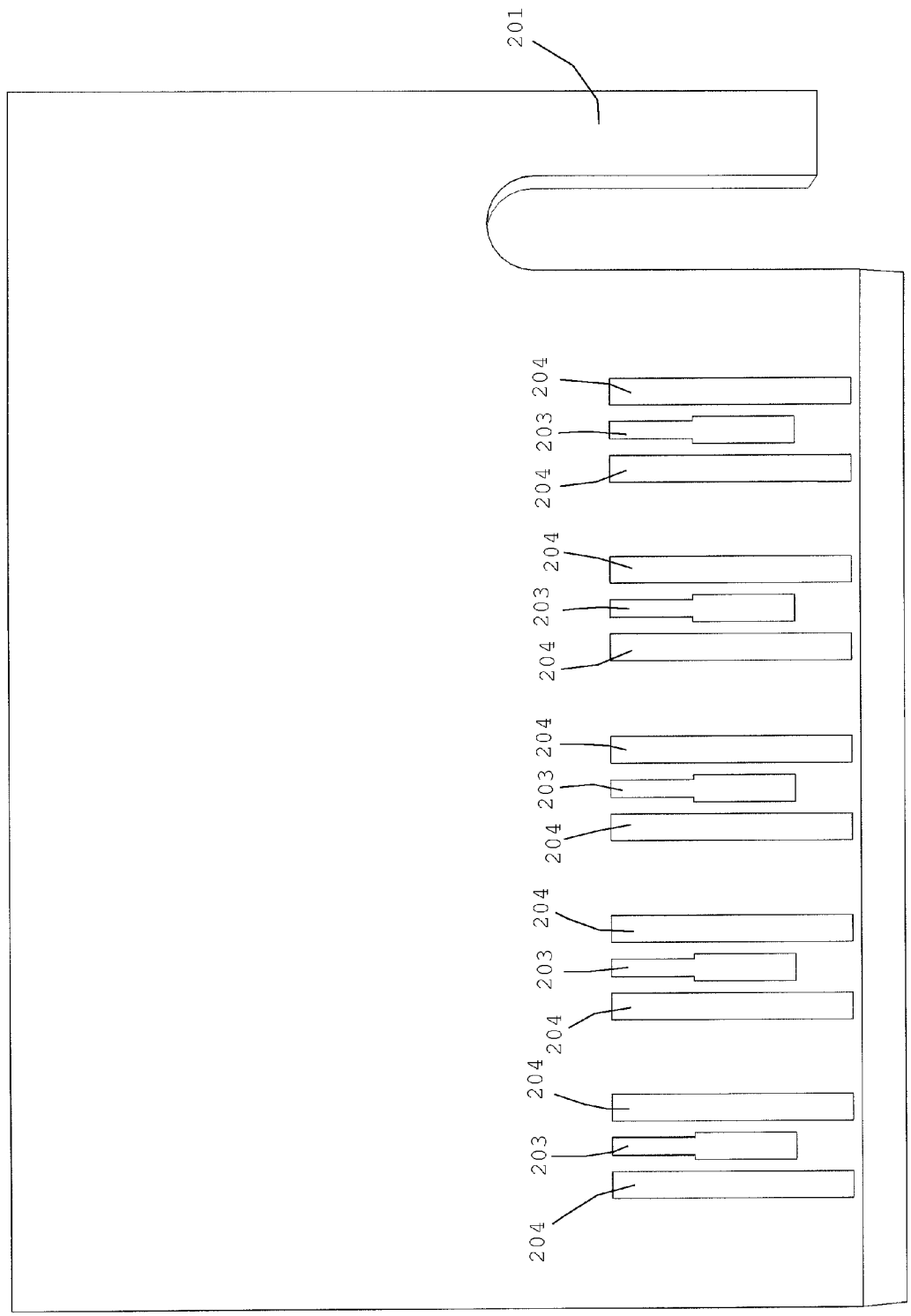
FIG. 6 is a front view of the edge card shown in FIG. 1.
Figure 7:
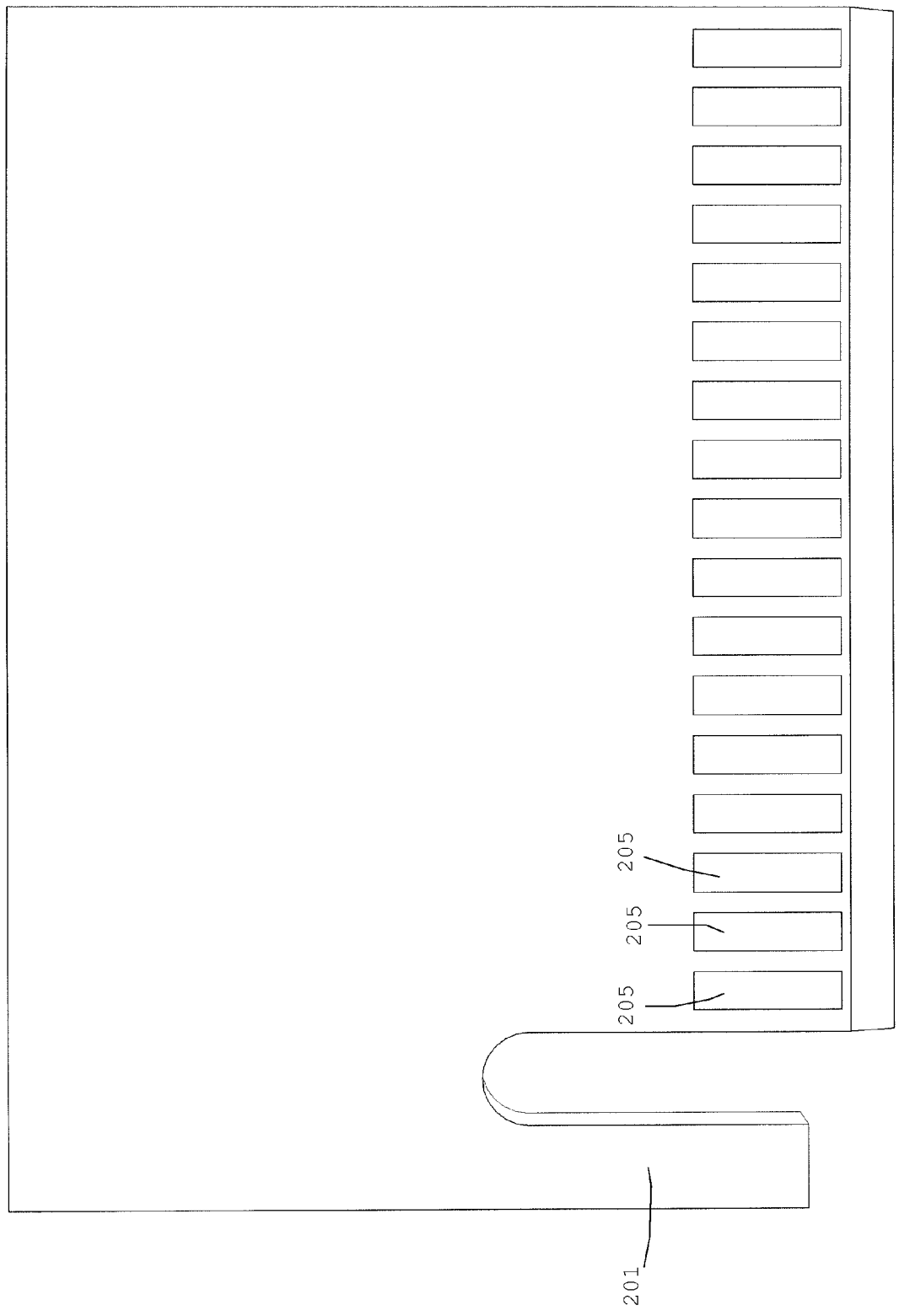
FIG. 7 is a rear view of the edge card shown in FIG. 1.

As shown in FIG. 6, the edge card 200 includes contact pads 203 and 204 that are provided along an edge of a first main surface of the edge card 200. The contact pads 203 are arranged on the edge card 200 to be aligned with the center conductors 102, and the contact pads 204 are arranged on the edge card 200 to be aligned with edges 121d and 122d (shown in FIG. 8) of sidewalls 121 and 122 of the shields 103 when the edge card 200 is inserted into the connector 100. Further, as shown in FIG. 7, the edge card 200 includes contact pads 205 that are provided along an edge of a second main surface of the edge card 200. For the sake of simplicity, only some of the contact pads 205 are labeled in the drawings. The contact pads 205 are arranged on the edge card 200 to be aligned with the contacts 104 when the edge card 200 is inserted into the connector housing 101.

Figure 8:
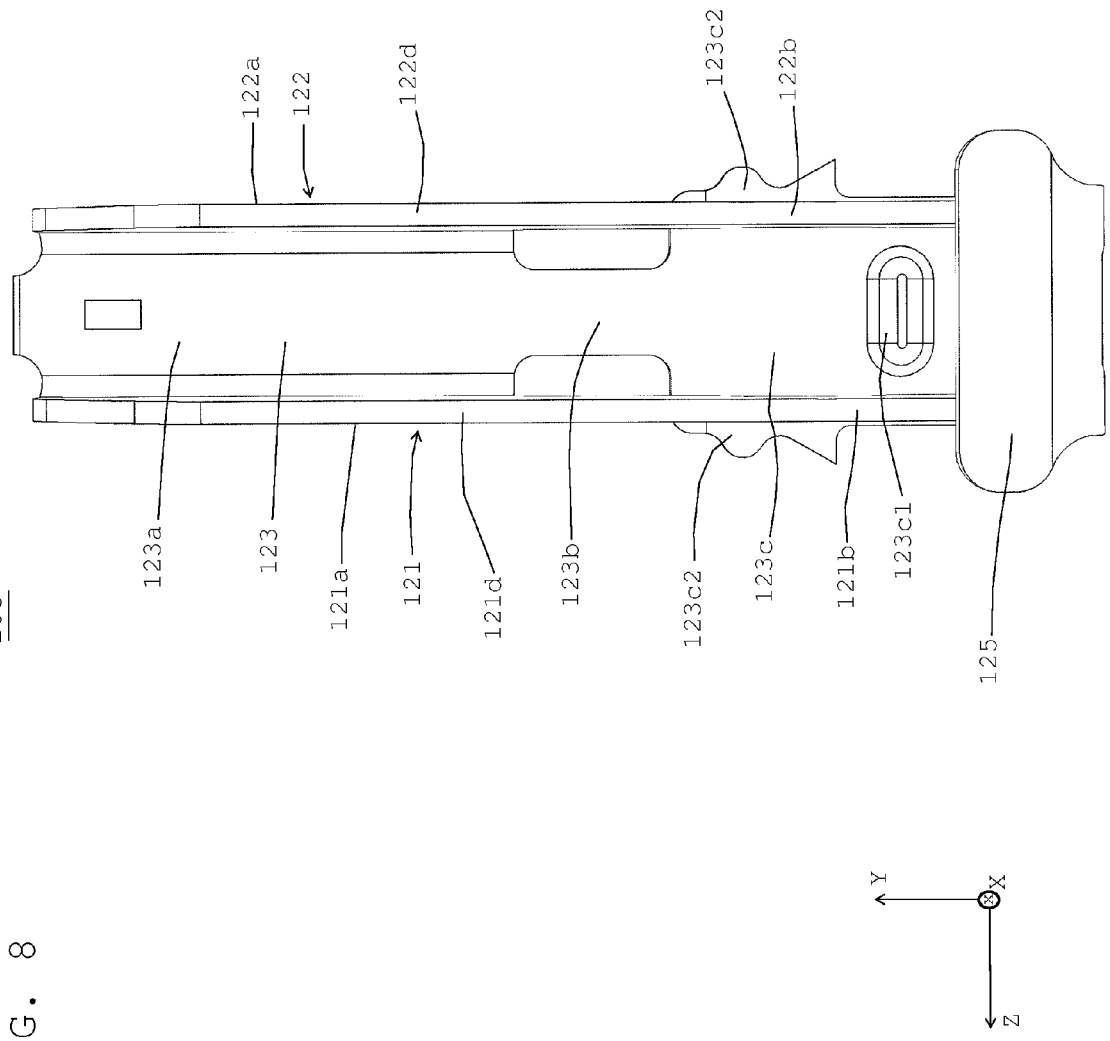
FIG. 8 is a front view of a shield shown in FIG. 1.

FIGS. 5 and 8-10 show the details of the shield 103. The shield 103 includes a first sidewall 121 and a second sidewall 122 that are spaced apart from one another and that are arranged to extend parallel or substantially parallel to one another. The first 121 and second 122 sidewalls are connected by the back wall 123 that extends perpendicularly or substantially perpendicularly to the first 121 and second 122 sidewalls. As shown in FIG. 8, the first sidewall 121, the end wall 123, and the second sidewall 122 of the shield 103 form a U-shape or substantially U-shape that is configured to surround three sides of the center conductor 102.

Figure 9:
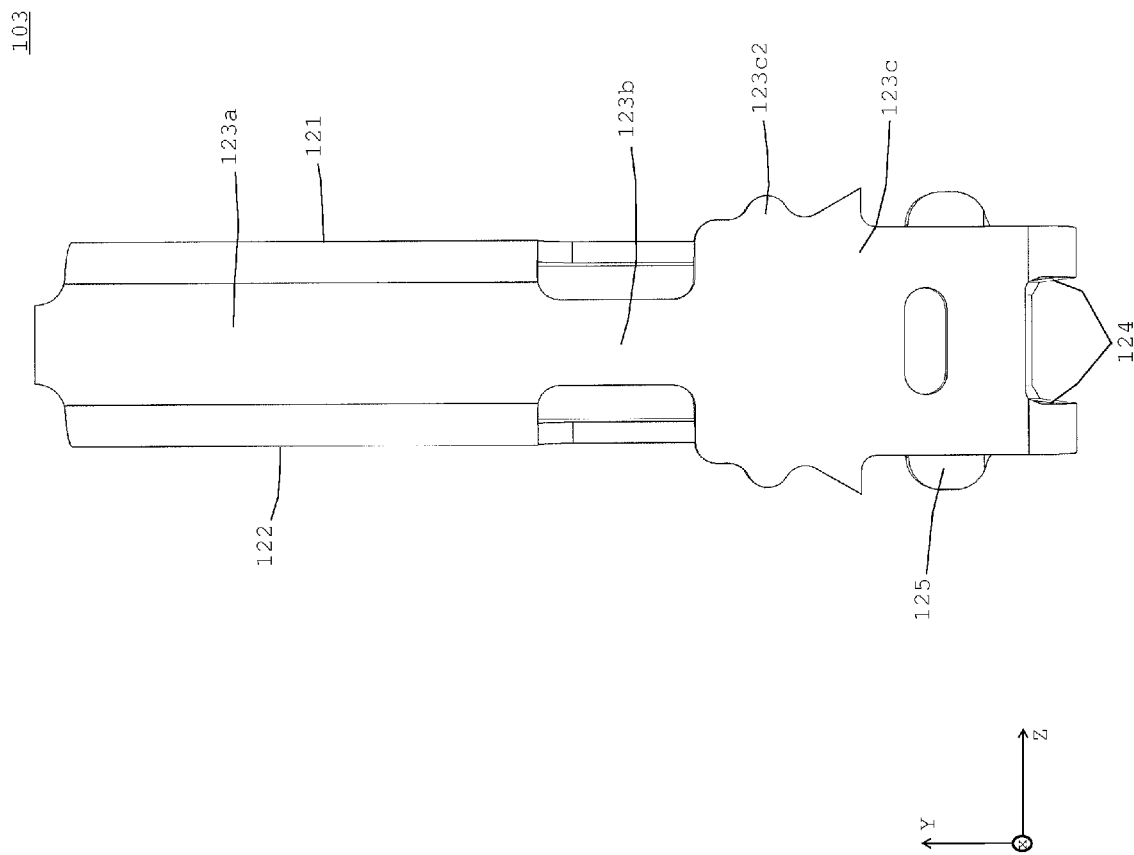
FIG. 9 is rear view of the shield shown in FIG. 1.

As shown in FIGS. 8 and 9, the end wall 123 includes an upper portion 123a that connects the first and second sidewalls 121 and 122, a base portion 123c, and a narrow beam portion 123b connecting the upper portion 123a and the base portion 123c. As shown in FIGS. 5 and 8, the base portion 123c includes a projection 123c1 that extends from an interior surface of the base portion 123c and including extensions 123c2 that extend from edges of the base portion 123c. The connector housing 101 includes slots 115 into which the base portion 123c of the back wall 123 is disposed and the projection 123c1 and the extensions 123c2 engages with surfaces of the slot 115 to press fit the shield 103 in the slot 115, preventing the shield 103 from moving within the slot 115. Although the base portion 123c of the shield 103 according to the present preferred embodiment preferably includes the projection 123c1 and the extensions 123c2, any suitable structure or structures can be provided to prevent the shield 103 from moving within the slot 115.

Figure 10:
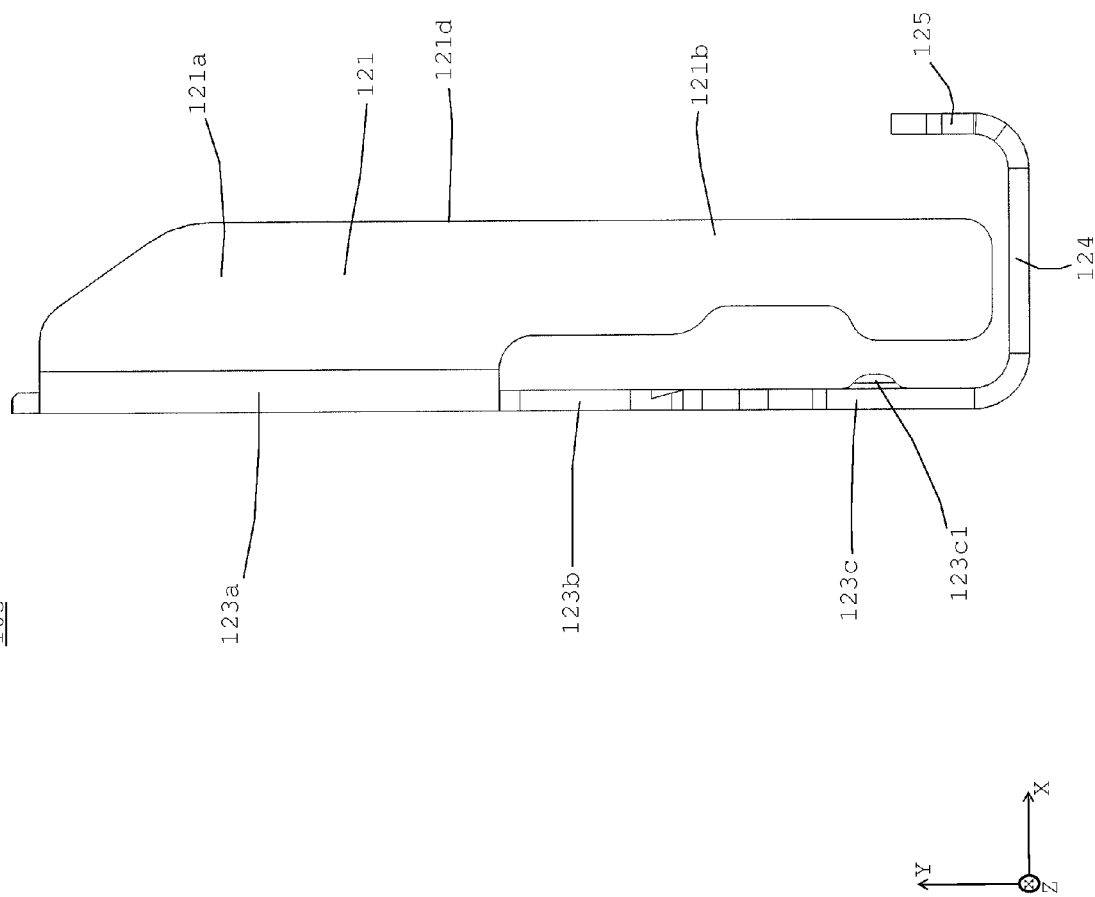
FIG. 10 is a side view of the shield shown in FIG. 1.

As shown in FIGS. 5 and 12, the base portion 123c of the shield 103 preferably includes two tails 124 can be soldered to the solder pads 303 of the printed circuit board 300. The tails 124 extend from the base portion 123c of the shield 103 in a direction towards the elongated slot 107 of the connector housing 101, as shown in FIG. 5. Each of the tails 124 extend in a horizontal or substantially horizontal direction, and a shield plane 125 extends from ends of the tails 124 in a vertical or substantially vertical direction. The shield plane 125 of each of the shields 103 is arranged to prevent or minimize crosstalk between the contacts 104 and the center conductors 102 such that unwanted signals from the contacts 104 are transferred directly into the printed circuit board 300 and not into the signal path of the center conductors 102. Preferably, as shown in FIGS. 4, 5, and 10, the shield plane 125 of each of the shields 103 extends upwardly from the tails 124 in a vertical or substantially vertical direction to be disposed between the lower portions of the center conductors 102 and the lower portions of the contacts 104. However, the shield plane 125 can have any suitable shape, including individual fingers and overlapping walls, as long as it prevents or minimizes crosstalk between the contacts 104 and the center conductors 102.

The narrow beam portion 123b has a width that is less than both the width of the base portion 123c and the width of the upper portion 123a. As shown in FIGS. 9 and 10, each of the first 121 and second 122 sidewalls includes upper portions 121a and 122a that are directly connected to the upper portion 123a of the back wall 123 and includes lower portions 121b and 122b that are spaced from the end wall 123 such that a gap is provided between the lower portions 121b and 122b and the end wall 123.

Figure 11:
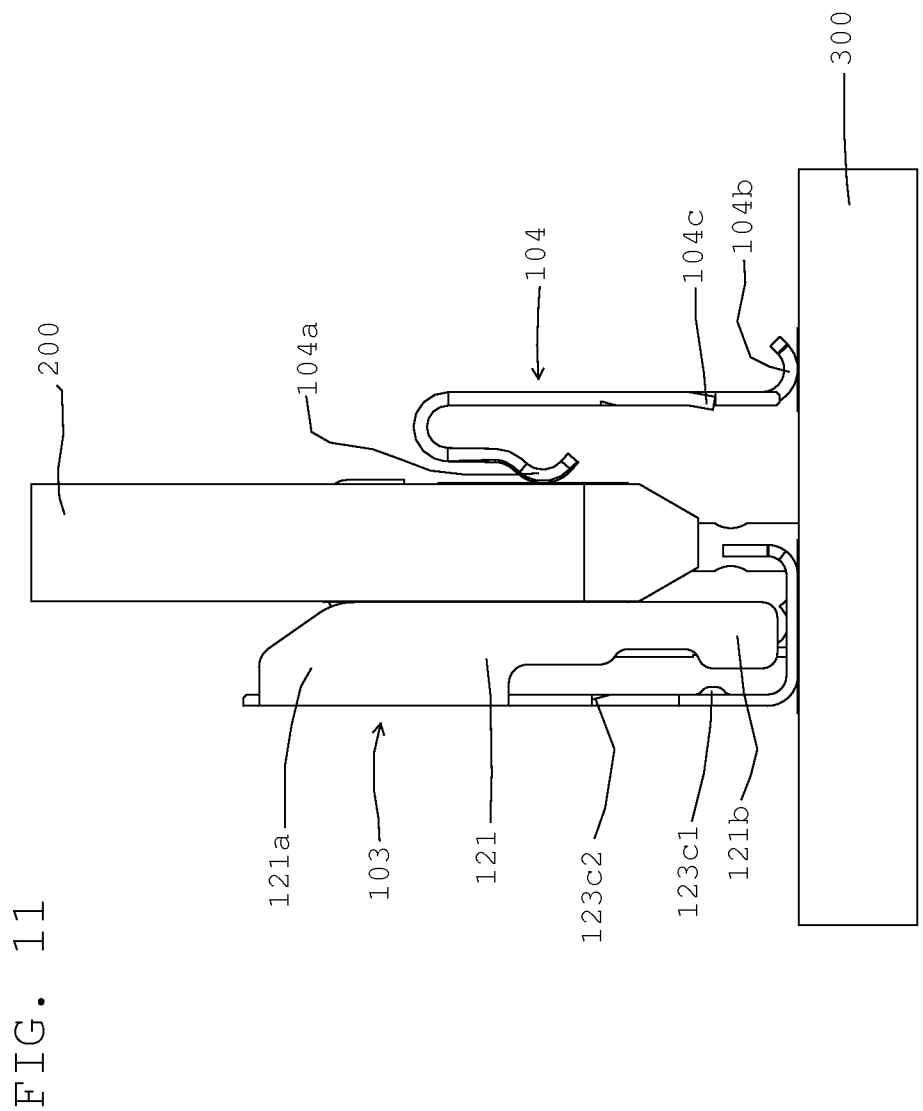
FIG. 11 is a side view of the edge card mounted on the printed circuit board shown in FIG. 1 without showing the connector housing.

As shown in FIGS. 11-13, when the edge card 200 is inserted into the connector housing 101, the head 104a of each of the contacts 104, edges 121d and 122d of each of the shields 103, and the head 102a of each of the center conductors 102 are in contact with the respective contact pads 202, 204, and 203 of the edge card 200.

The contacts 104 are arranged to provide a sufficient normal force to bias the edge card 200 towards the shields 103 and the center conductors 102 such that all of the edges 121d and 122d of the sidewalls 121 and 122 of the shields 103 are securely in contact with a respective contact pad of the edge card 200. In the present preferred embodiment, three contacts 104 are preferably provided for each of the shields 103, for example. However, any suitable number of contacts 104 can be provided for each shield 103. In addition to providing a sufficient normal force, the contacts can also preferably transmit low speed signal or power signals, for example.

Figure 14A:
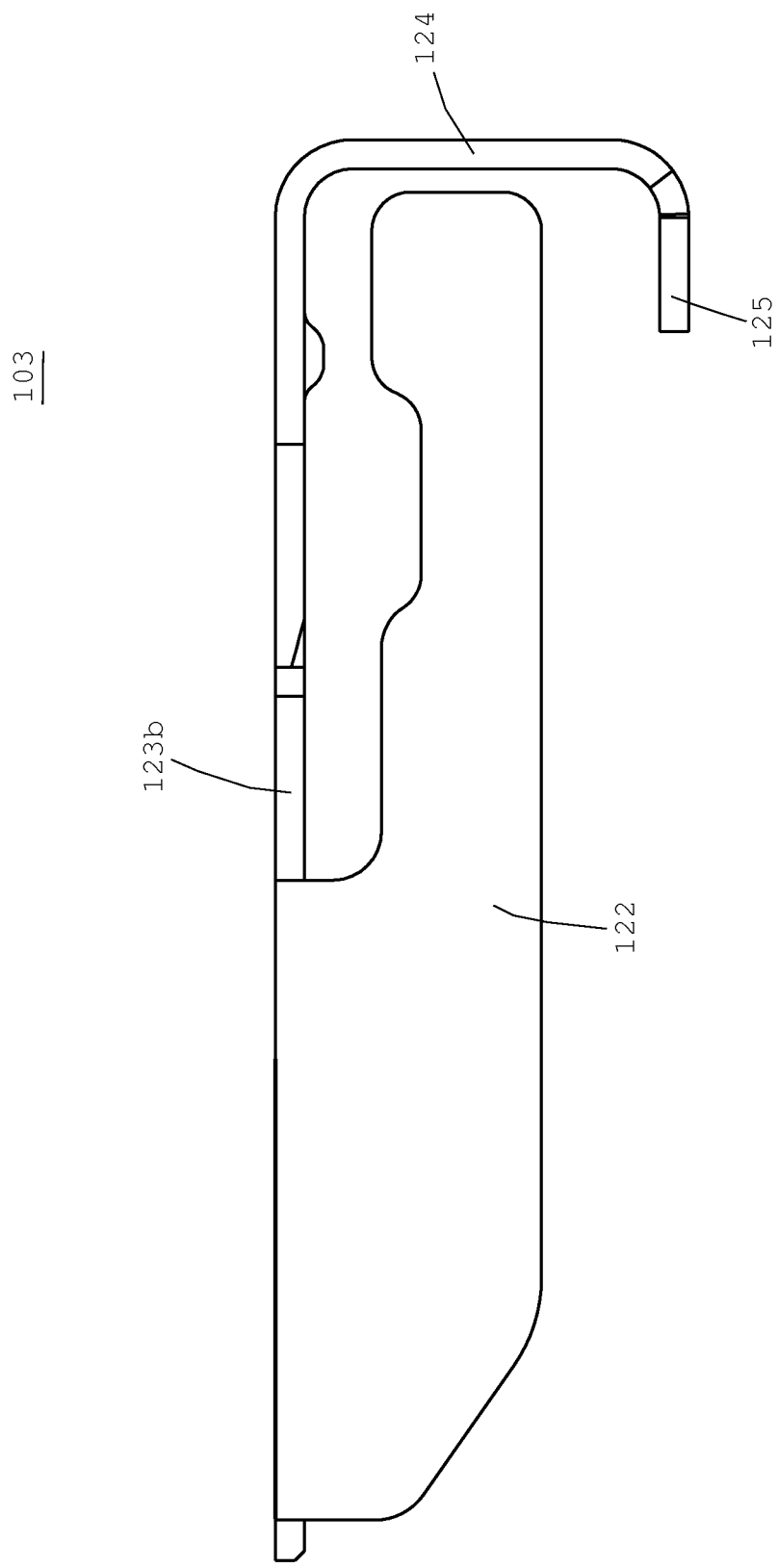
FIGS. 14A-14E show the shield according to a preferred embodiment of the present invention.
Figure 14B:
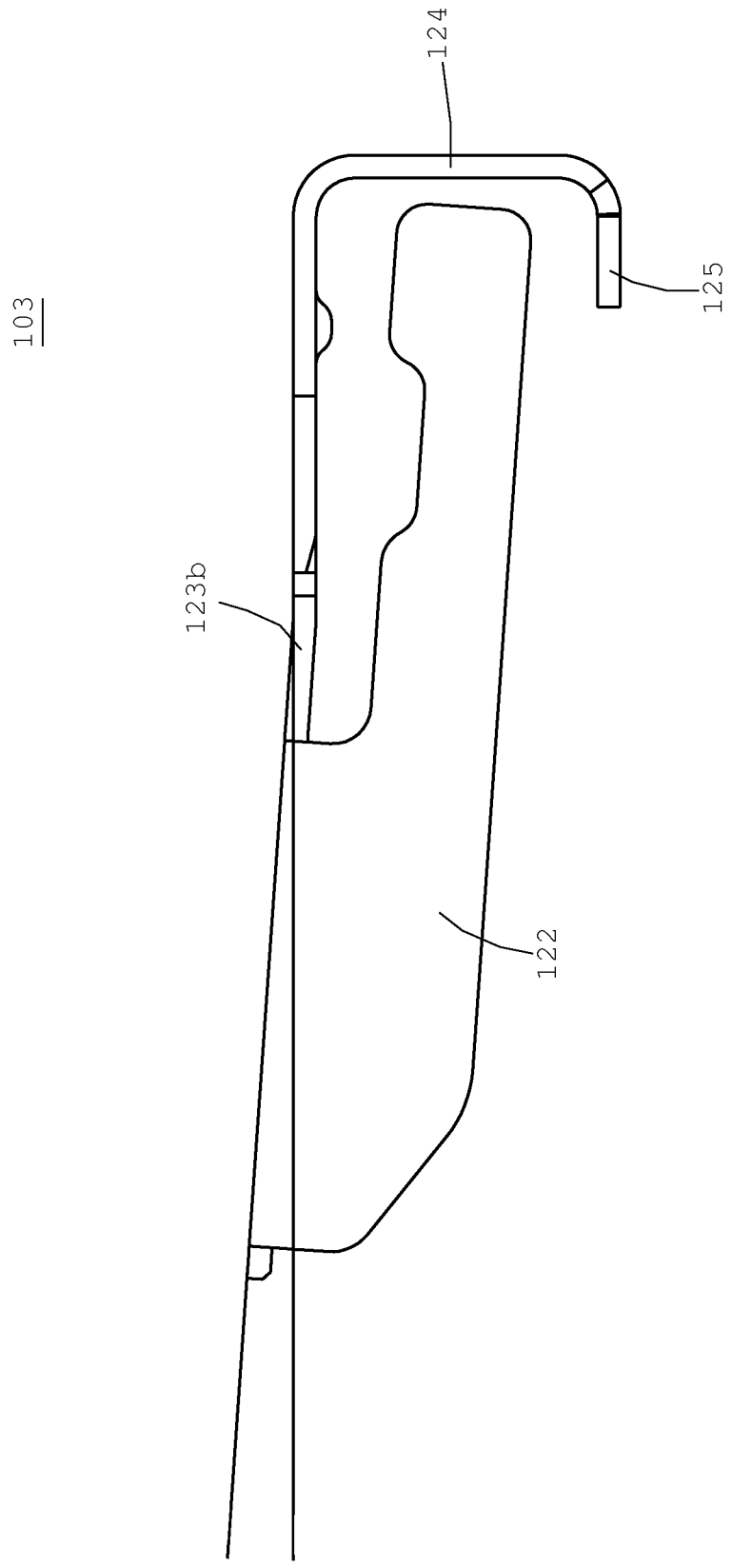
Figure 14C:
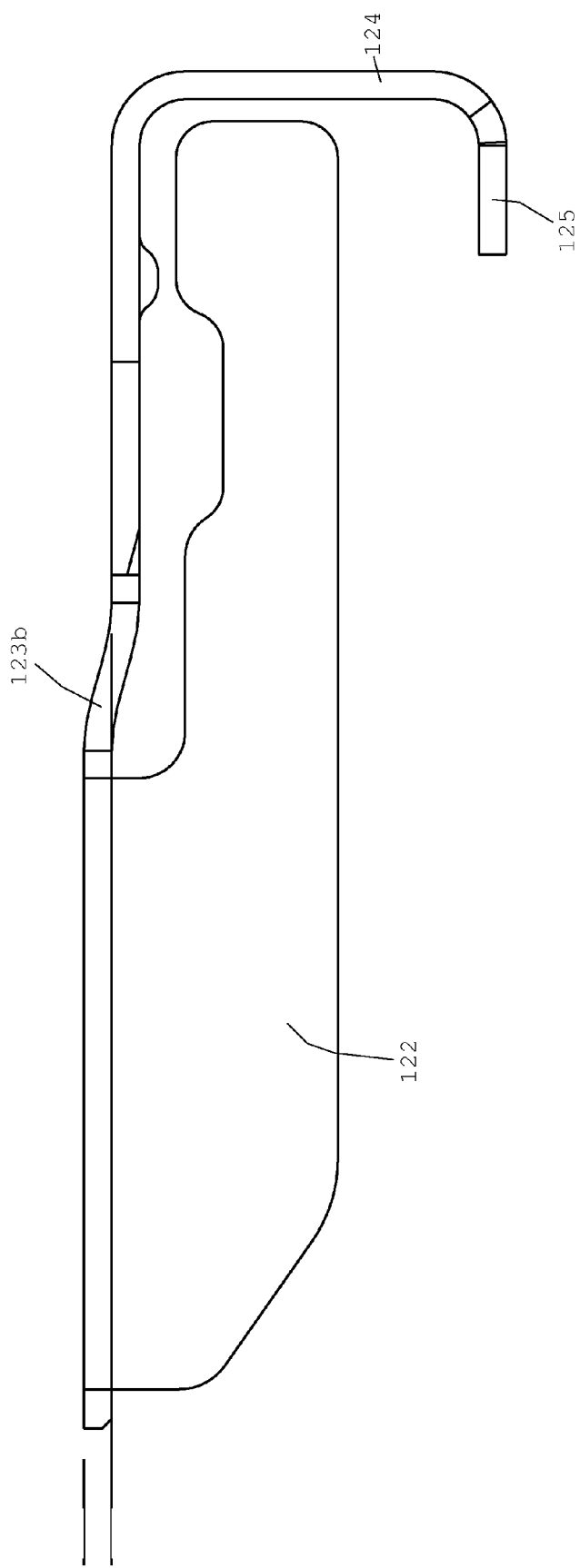
Figure 14D:
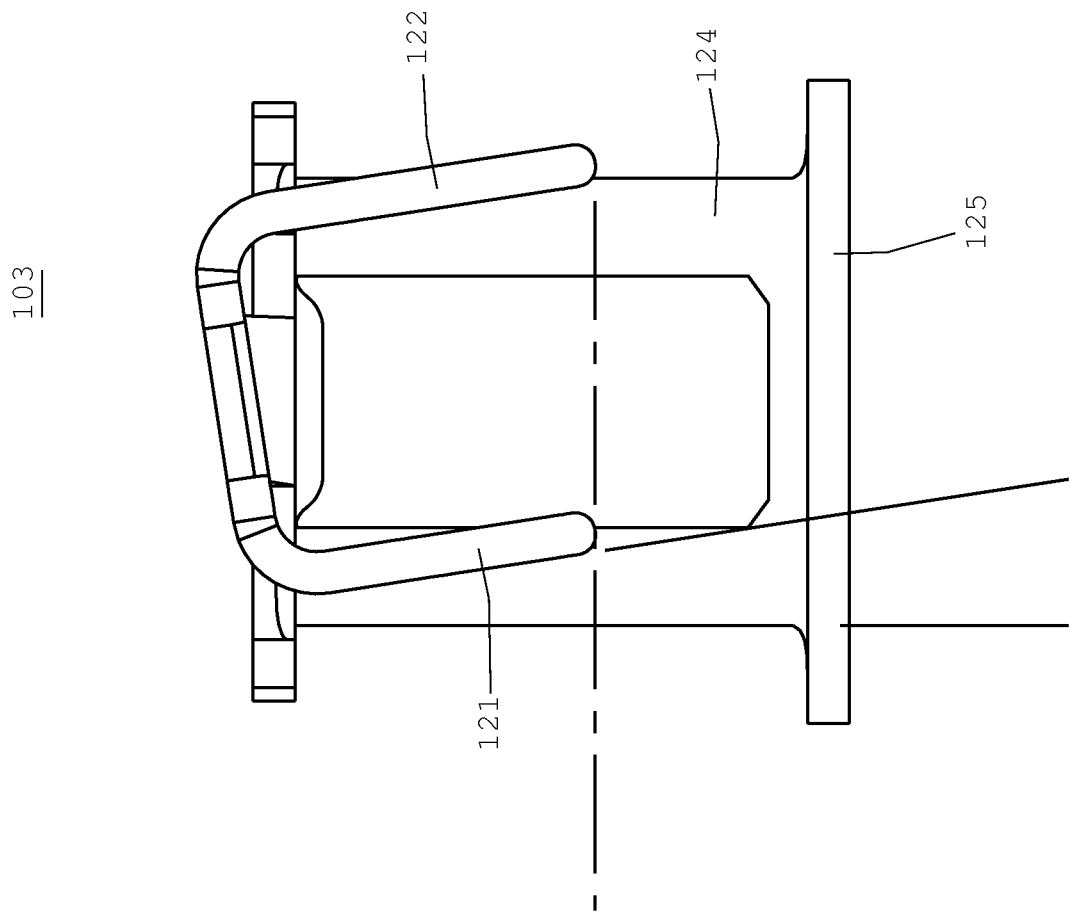
Figure 14E:
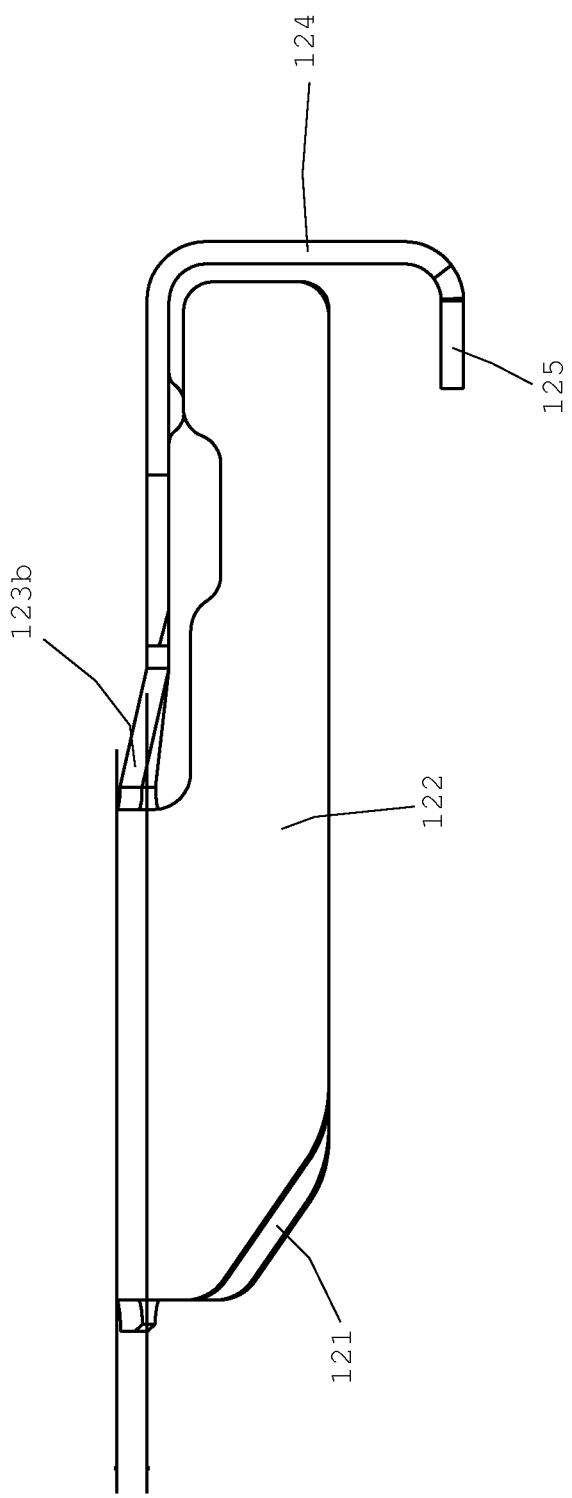

The shields 103 are configured to enable angular displacement about the Y- and Z-axes as shown in FIGS. 10 and 14A-14B. Particularly, the narrow beam 123b is configured to enable the upper portion 123a to rotate about the Y-axis and to enable the upper surface 123a of the back wall 123 to not only rotate about the Z-axis, but also to be linearly displaced in a direction away from the elongated slot 107 of the connector housing 101. By enabling the shields 103 to be angularly displaced about both the Y-axis and the Z-axis, physical and electrical contact between the contact pads 204 on the edge card 200 and the edges 121d and 122d of the shields 103 is ensured even if the contact pads 204 on the edge card 200 are not coplanar with one another or if the edges 121d and 122d of the contacts 103 are not coplanar with one another.

In addition, the edges 121d and 122d of the shields 103 preferably have a curved surface to ensure physical and electrical contact with the contact pads 204 of the edge card 200, even if the contact pads 204 on the edge card 200 are not coplanar with one another or if the edges 121d and 122d of the contacts 103 are not coplanar with one another. However, the edges 121d and 122d of the shields 103 are not required to have a curved surface and can, instead, have a flat or substantially flat surface. The configuration of the shields 103, including the narrow beam portion 123b and the lower portions 121b and 122b of the sidewalls 121 and 122, facilitates the insertion of the edge card 200 into the connector 100 and ensures that the edges 121d and 122d of the shields 103 are in physical and electrical contact with the contact pads 204 of the edge card 200.

As noted above, the shields 103 are preferably U-shaped or substantially U-shaped so as to surround three sides of a corresponding center conductor 102. Further, ground plane or planes in the edge card 200 extend or extends parallel to the fourth side of the center conductors 102 that is not surrounded by one of the shields 103. Thus, the combination of the U-shaped or substantially U-shaped shields 103 and the edge card 200 surrounds all four sides of the center conductors 102 to prevent or minimize crosstalk between the center conductors 102. To prevent or minimize crosstalk between the center conductors 102, the edges 121d and 122d of the contacts 103 are desired to be in proper physical and electrical contact with the contact pads 204 if the edge card 200. Thus, the shields 103 are configured to ensure proper physical and electrical contact between the edges 121d and 122d of the shields 103 and the contact pads 204 of the edge card 200. In addition to the configuration of the shields 103 described above, the number and arrangement of the contacts 104 are selected to provide a sufficient normal force to ensure physical and electrical contact between the edges 121d and 122d of the shields 103 and the contact pads 204 of the edge card 200. Instead of using contacts 104, it is possible to use compression springs, wedges, or internal ramps to provide a sufficient normal force to ensure physical and electrical contact between the edges 121d and 122d of the shields 103 and the contact pads 204 of the edge card 200.

In addition, the shields 103 can be tuned to a desired reference impedance by varying the spacing between the sidewalls 121 and 122 of the shields 103, the spacing between the sidewalls 121 and 122 of the shields 103 and the center conductor 102, and the spacing between the contact pads 204 and 203 of the edge card 200. By tuning the shields 103 to the desired reference impedance, the return loss of the connector 100 is improved.

In addition to preventing or minimizing crosstalk between the center conductors 102, the U-shaped or substantially U-shaped shields 103 protect the center conductors 102 from being damaged since the center conductors 102 are surrounded on three sides by the shields 103.

The connector housing 101 is preferably configured to provide a clearance around each of the shields 103 to allow each of the shields to rotate and twist to ensure physical and electrical contact between the edges 121d and 122d of the shields 103 and the contacts 204 of the edge card 200. Further, the connector housing 101 is preferably made of any suitable plastic, including polymers with a differential dielectric constant value.

In the present preferred embodiment, the shields 103, center conductors 102, and the contacts 104 are each preferably made of a single piece of stamped metal, for example. However, the shields 103 can include a plurality of pieces. Preferably, the metal used for the shields 103, the center conductors 102, and the contacts 104 is copper or a copper alloy; however, any suitable metal can also be used. In addition, in the present preferred embodiment, each of the shields 103 is preferably U-shaped or substantially U-shaped, for example. However, each of the shields 103 can have any suitable shape, such as semi-circular or substantially semi-circular, for example, as long as the shields 103 prevent or minimize crosstalk between the center conductors 102. The shields 103, the center conductors 102, and the contacts 104 can be made by any suitable method, including machined from solid stock.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An edge card connector comprising:
a connector housing;
first and second center conductors disposed in the connector housing, spaced apart from one another, and arranged to make contact with a surface of an edge card when the edge card is inserted into the edge card connector; and
first and second shields disposed in the connector housing, surrounding three sides of either the first center conductor or the second center conductor, and arranged to make contact with the surface of the edge card when the edge card is inserted into the edge card connector; wherein
each of the first and second shields includes a fixed portion that is fixed with respect to the connector housing and a movable portion that is movable with respect to the connector housing;
the movable portion of each of the first and second shields is arranged to rotate about two different perpendicular axes and to be linearly displaced with respect to the surface of the edge card when the edge card is inserted into the edge card connector.

2. The edge card connector according to claim 1, wherein each of the first and second shields is U-shaped or substantially U-shaped.

3. The edge card connector according to claim 1, further comprising:
a plurality of contacts; wherein
the first and second center conductors and the first and second shields are arranged to contact a first side of the edge card when the edge card is inserted into the edge card connector; and
the plurality of contacts are arranged to contact a second side of the edge card opposite to the first side of the edge card when the edge card is inserted into the edge card connector.

4. The edge card connector according to claim 3, wherein the plurality of contacts are arranged to provide a normal force to bias the edge card against the first and second center conductors and against the first and second shields.

5. The edge card connector according to claim 3, wherein a number of the plurality of contacts is at least six.

6. The edge card connector according to claim 1, wherein each of the first and second shields includes first and second sidewalls that are spaced apart from one another and a back wall connecting the first and second sidewalls.

7. The edge card connector according to claim 6, wherein:
the back wall of each of the first and second shields includes a base portion that is included in the fixed portion, an upper portion that is connected to the first and second sidewalls and that is included in the movable portion, and a narrow beam portion connecting the base portion and the upper portion; and
the narrow beam portion is arranged to enable the upper portion to rotate about the two different perpendicular axes and to be linearly displaced with respect to the base portion and with respect to the surface of the edge card when the edge card is inserted into the edge card connector.

8. The edge card connector according to claim 6, wherein the first and second sidewalls of each of the first and second shields are directly connected to the upper portion of the back wall and are not directly connected to the narrow beam portion or to the base portion of the back wall.

9. The edge card connector according to claim 6, wherein each of the first and second shields includes at least one tail that extends from the base portion and that is arranged to be soldered to solder pads of a printed circuit board on which the edge card connector is mounted.

10. The edge card connector according to claim 9, wherein each of the first and second shields includes a shield plane that extends from the at least one tail.

11. The edge card connector according to claim 6, wherein the first and second sidewalls include edges that are arranged to be in contact with contact pads of the edge card when the edge card is inserted into the edge card connector.

12. The edge card connector according to claim 11, wherein the first and second sidewalls and the back wall of each of the first and second shields are arranged to cooperate with the edge card to surround four sides of either the first center conductor or the second center conductor when the edge card is inserted into the edge card connector.

13. A shield for use in an edge card connector to shield a center conductor from crosstalk comprising:
first and second spaced apart sidewalls; and
a back wall extending between the first and second sidewalls; wherein
the back wall includes a base portion, an upper portion that is connected to the first and second sidewalls, and a narrow beam portion connecting the base portion and the upper portion; and
the narrow beam portion is arranged to enable the upper portion to rotate about two different perpendicular axes and to be linearly displaced with respect to the base portion.

14. The shield according to claim 13, wherein the first and second sidewalls are directly connected to the upper portion of the back wall and are not directly connected to the narrow beam portion or to the base portion of the back wall.

15. The shield according to claim 13, further comprising at least one tail extending from the base portion and arranged to be soldered to solder pads of a printed circuit board upon which the shield is mounted.

16. The shield according to claim 15, further comprising a shield plane extending from the at least one tail.

17. The shield according to claim 13, wherein each of the first and second sidewalls includes an edge that is arranged to be in contact with a contact pad of an edge card when the edge card is inserted into the edge card connector.

18. The shield according to claim 17, wherein the first and second sidewalls and the back wall are arranged to cooperate with the edge card to surround four sides of the center conductor when the edge card is inserted into the edge card connector.

19. An edge card connector comprising:
a connector housing;
first and second center conductors disposed in the connector housing, spaced apart from one another, and arranged to make contact with a surface of an edge card when the edge card is inserted into the edge card connector; and
first and second shields disposed in the connector housing, surrounding three sides of either the first center conductor or the second center conductor, and arranged to make contact with the surface of the edge card when the edge card is inserted into the edge card connector; wherein
each of the first and second center conductors includes a fixed portion that is fixed with respect to the connector housing and a movable portion that is movable with respect to the connector housing;
each of the first and second shields includes a fixed portion that is fixed with respect to the connector housing and a movable portion that is movable with respect to the connector housing; and
only air is located between the movable portion of each of the first and second center conductors and the corresponding movable portion of each of the first and second shields.

20. An edge card connector comprising:
a connector housing;
first and second center conductors disposed in the connector housing and spaced apart from one another; and
first and second shields disposed in the connector housing and surrounding three sides of either the first center conductor or the second center conductor; wherein
each of the first and second center conductors includes a contact portion that is arranged to make contact with a surface of an edge card when the edge card is inserted into the edge card connector; and
two sides of each of the first and second shields are arranged to make contact along the surface of the edge card, when viewed from a side of the edge card connector, from below to above where the contact portion makes contact with a surface of the edge card when the edge card is inserted into the edge card connector.

21. A substrate comprising:
first and second signal pads arranged on a surface of the substrate; and
first, second, third, and fourth ground pads arranged on the surface of the substrate such that:
the first and second ground pads are on opposite sides of the first signal pad and are located closer to the first signal pad than any other signal pad or ground pad; and
the third and fourth ground pads are on opposite sides of the second signal pad and are located closer to the second signal pad than any other signal or ground pad; wherein
the first, second, third, and fourth ground pads are longer than the first and second signal pads and are arranged such that, when viewed in plan, the first, second, third, and fourth ground pads extend above and/or below the first and second signal pads.

22. A substrate of claim 21, wherein the first and second signal pads and the first, second, third, and fourth ground pads are arranged along an edge of the substrate.

\* \* \* \* \*